United States Patent
Kim et al.

(10) Patent No.: US 12,183,225 B2
(45) Date of Patent: Dec. 31, 2024

(54) DISPLAY APPARATUS AND METHOD OF MANUFACTURING THE SAME

(71) Applicant: Samsung Display Co., Ltd., Yongin-Si (KR)

(72) Inventors: Cha-dong Kim, Seoul (KR); Youngdae Kim, Seoul (KR); Hyunae Kim, Seoul (KR); Chongsup Chang, Hwaseong-si (KR); Eui-kang Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 830 days.

(21) Appl. No.: 17/291,008

(22) PCT Filed: Feb. 1, 2019

(86) PCT No.: PCT/KR2019/001466
§ 371 (c)(1),
(2) Date: May 4, 2021

(87) PCT Pub. No.: WO2020/096138
PCT Pub. Date: May 14, 2020

(65) Prior Publication Data
US 2022/0045149 A1   Feb. 10, 2022

(30) Foreign Application Priority Data

Nov. 8, 2018   (KR) .................. 10-2018-0136593

(51) Int. Cl.
*G09G 3/00*   (2006.01)
*G09G 3/3233*   (2016.01)
(Continued)

(52) U.S. Cl.
CPC ........... *G09G 3/006* (2013.01); *G09G 3/3233* (2013.01); *G09G 3/3291* (2013.01);
(Continued)

(58) Field of Classification Search
CPC ....... G09G 2330/12; G09G 2300/0413; G09G 3/006
See application file for complete search history.

(56) References Cited

U.S. PATENT DOCUMENTS 9,245,468 B2 *  1/2016  Lee .................. G09G 3/006
9,490,305 B2 * 11/2016  Lee .................. H10K 59/351
(Continued)

FOREIGN PATENT DOCUMENTS

CN      103246092 A    8/2013
JP      2017-188505 A  10/2017
(Continued)

OTHER PUBLICATIONS

Chinese Office Action corresponding to Application No. 201980073635.5, dated on Feb. 22, 2024, 9 pages.

*Primary Examiner* — Patrick F Marinelli
(74) *Attorney, Agent, or Firm* — Innovation Counsel LLP

(57) ABSTRACT

A display apparatus includes a base substrate including a display region in which an image is displayed and a peripheral region that is a non-display region adjacent to the display region, a plurality of pixels disposed on the base substrate in the display region, each of the pixels including a thin film transistor that includes an oxide semiconductor pattern, a data driver disposed in the peripheral region and configured to provide a data voltage to the pixels, and a plurality of test patterns disposed on the base substrate in the peripheral region, each of the test patterns including a test thin film transistor that includes a test oxide semiconductor pattern.

18 Claims, 10 Drawing Sheets

(51) Int. Cl.
*G09G 3/3291* (2016.01)
*H01L 29/786* (2006.01)

(52) U.S. Cl.
CPC .............. *H01L 29/78606* (2013.01); *G09G 2300/0426* (2013.01); *G09G 2320/029* (2013.01); *G09G 2320/0693* (2013.01); *G09G 2330/12* (2013.01)

(56) References Cited

U.S. PATENT DOCUMENTS

| | | | | |
|---|---|---|---|---|
| 9,508,274 | B2* | 11/2016 | Ro | H01L 27/1251 |
| 9,691,343 | B2* | 6/2017 | Lim | G06F 3/0445 |
| 10,170,380 | B2 | 1/2019 | Zhang et al. | |
| 10,453,396 | B2* | 10/2019 | Koong | G09G 3/3258 |
| 10,971,560 | B2* | 4/2021 | Kim | G09G 3/006 |
| 11,011,438 | B2* | 5/2021 | Ko | H01L 27/1237 |
| 11,790,853 | B2* | 10/2023 | Jeong | G09G 3/3233 |
| | | | | 345/212 |
| 11,854,481 | B1* | 12/2023 | Yin | G09G 3/3233 |
| 2014/0062520 | A1* | 3/2014 | Kim | G09G 3/3225 |
| | | | | 324/762.01 |
| 2014/0203835 | A1* | 7/2014 | Ro | H01L 27/1251 |
| | | | | 324/760.02 |
| 2014/0347401 | A1* | 11/2014 | Hwang | G09G 3/3233 |
| | | | | 345/82 |
| 2015/0162251 | A1* | 6/2015 | Jeong | H10K 59/12 |
| | | | | 438/158 |
| 2017/0061918 | A1* | 3/2017 | Lim | G06F 3/0445 |
| 2017/0287946 | A1* | 10/2017 | Hiromasu | H01L 27/1218 |
| 2018/0122302 | A1* | 5/2018 | Koong | G09G 3/3266 |
| 2018/0336809 | A1* | 11/2018 | Xi | G09G 3/20 |
| 2019/0348478 | A1* | 11/2019 | Kim | G09G 3/006 |
| 2020/0075632 | A1* | 3/2020 | Long | H01L 29/41733 |
| 2021/0295777 | A1* | 9/2021 | Jeong | G09G 3/3233 |
| 2021/0375213 | A1* | 12/2021 | Gao | G09G 3/3233 |
| 2022/0004067 | A1* | 1/2022 | Sasanuma | H05K 1/189 |
| 2022/0045149 | A1* | 2/2022 | Kim | H01L 29/78606 |
| 2022/0319408 | A1* | 10/2022 | Wang | G09G 3/3225 |
| 2022/0320196 | A1* | 10/2022 | He | G09G 3/3233 |
| 2022/0320228 | A1* | 10/2022 | Du | G09G 3/3291 |
| 2023/0410740 | A1* | 12/2023 | Yin | G09G 3/3233 |
| 2023/0419873 | A1* | 12/2023 | Chun | G09G 3/2096 |

FOREIGN PATENT DOCUMENTS

| | | |
|---|---|---|
| KR | 10-2012-0121586 A | 11/2012 |
| KR | 10-2013-0112175 A | 10/2013 |
| KR | 10-2014-0030682 A | 3/2014 |
| KR | 10-2015-0022181 A | 3/2015 |
| KR | 10-2016-0119399 A | 10/2016 |
| KR | 10-2017-0015698 A | 2/2017 |
| KR | 10-2017-0038345 A | 4/2017 |
| KR | 10-2018-0060530 A | 6/2018 |
| KR | 10-2018-0062276 A | 6/2018 |
| KR | 10-2018-0062585 A | 6/2018 |
| KR | 10-2018-0062587 A | 6/2018 |
| KR | 10-2018-0066375 A | 6/2018 |
| KR | 10-1868435 B1 | 6/2018 |
| KR | 10-1868920 B1 | 6/2018 |

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2018-0136593, filed on Nov. 8, 2018 and PCT Application No PCT/KR2019/001466, filed on Feb. 1, 2019, the entire contents of which are incorporated herein by reference.

BACKGROUND

1. Field

The present inventive concept relates to a display apparatus. More particularly, the present inventive concept relates to a display apparatus having an improved display quality.

2. Description of the Related Art

In recent years, in virtue of advancement of technology, display devices which are smaller and lighter but has high performance are being produced. A flat panel display apparatus such as a plasma display apparatus, a liquid crystal display apparatus, an organic light emitting display apparatus, and the like is attracting attention because the flat panel display apparatus overcomes shortcomings of the CRT television in terms of size, weight, portability, power consumption and the like.

In a manufacturing process of the display apparatus, it is necessary to inspect a result of each process, for example, measure thickness, resistance, concentration, degree of contamination, critical dimension, and electrical characteristic of an element such as a thin film transistor, and the like. However, there are cases in which an actual substrate cannot be monitored because the inspection is destructive inspection.

SUMMARY

One object of the present inventive concept is to provide a display apparatus that can improve display quality by estimating characteristics of a thin film transistor in a display region using a test pattern that is disposed in a peripheral region.

According to an aspect of embodiments, a display apparatus may include a base substrate including a display region in which an image is displayed and a peripheral region that is a non-display region disposed adjacent to the display region, a plurality of pixels disposed on the base substrate in the display region, each of the pixels including a thin film transistor that includes a semiconductor pattern, a plurality of drivers disposed in the peripheral region and configured to provide driving signals to the pixels, and a plurality of test patterns disposed on the base substrate in the peripheral region between adjacent drivers, each of the test patterns including a test thin film transistor that includes a test semiconductor pattern.

In embodiments, the plurality of drivers may be data drivers.

In embodiments, the test semiconductor pattern of the test pattern may be formed to have a same material and a same shape as the semiconductor pattern of the pixel.

In embodiments, the display apparatus may further include a test lower conductive pattern disposed between the base substrate and the test semiconductor pattern and a lower conductive pattern disposed between the base substrate and the semiconductor pattern. In addition, the test thin film transistor may further include a test gate electrode that overlaps the test semiconductor pattern and a test source electrode and a test drain electrode that are electrically connected to the test semiconductor pattern. Further, the thin film transistor may further include a gate electrode that overlaps the semiconductor pattern and a source electrode and a drain electrode that are electrically connected to the semiconductor pattern.

In embodiments, the display apparatus may further include an interlayer insulating layer disposed between the test gate electrode and the test source electrode and the test drain electrode. In addition, each of the test patterns may further include a first test electrode disposed on the interlayer insulating layer and electrically connected to the test gate electrode via a contact hole that is formed through the interlayer insulating layer, a second test electrode disposed on the interlayer insulating layer and electrically connected to the test source electrode, and a third test electrode disposed on the interlayer insulating layer and electrically connected to the test drain electrode.

In embodiments, the display apparatus may further include an intermetal dielectric layer disposed on the thin film transistor, a first electrode disposed on the intermetal dielectric layer and electrically connected to the drain electrode of the thin film transistor, a light emitting layer disposed on the first electrode, and a second electrode disposed on the light emitting layer.

In embodiments, the display apparatus may further include an opposite substrate disposed on the base substrate and disposed to be spaced apart from the test pattern in a plan view.

In embodiments, the data driver may be an integrated circuit chip mounted on the base substrate.

In embodiments, the display apparatus may further include right-first and right-second power lines disposed on a right side of the test pattern with respect to the test pattern disposed between the two adjacent data drivers and left-first and left-second power lines disposed on a left side of the test pattern with respect to the test pattern disposed between the two adjacent data drivers. In addition, the right-first power line and the right-second powerline may extend from the data driver that is disposed on the right side of the test pattern and may provide first power and second power to corresponding pixels in the display region. Further, the left-first power line and the left-second power line may extend from the data driver that is disposed on the left side of the test pattern and may provide the first power and the second power to corresponding pixels in the display region.

In embodiments, the test patterns may be disposed to be spaced apart from each other along a length direction of the peripheral region.

In embodiments, the display apparatus may further include a test region disposed adjacent to the peripheral region. In addition, the peripheral region may be disposed between the test region and the display region. Further, a plurality of test pads that are electrically connected to the pixels of the display region may be formed in the test region.

In embodiments, the test region may be cut and removed after a test of the display apparatus is completed.

In embodiments, the display apparatus may further include a compensation circuit part electrically connected to the test patterns and configured to sense a characteristic of the test thin film transistor of each of the test patterns and to compensate for a driving voltage based on an average and a distribution of the characteristic.

In embodiments, the characteristic may be a threshold voltage of the test thin film transistor and the driving voltage may be the data voltage.

In embodiments, the compensation circuit part may include a driver configured to provide a test driving voltage to the test thin film transistor of the each of the test patterns, a sensing part configured to receive a test signal from the test thin film transistor and to sense the characteristic of the test thin film transistor, and a compensating part configured to compensate for the driving voltage using the characteristic that is sensed.

In embodiments, the compensation circuit part may further include a storing part configured to store the characteristic that the sensing part senses and a voltage generating part configured to provide the compensated driving voltage to the data driver.

According to another aspect of embodiments, a display apparatus which includes a display region in which a plurality of pixels are disposed and a peripheral region that is a non-display region disposed adjacent to the display region may include a thin film transistor disposed in the display region and including a semiconductor and a plurality of test patterns disposed in the peripheral region between adjacent drivers. In addition, each of the test patterns may include a test thin film transistor including the semiconductor.

In embodiments, the drivers may be data drivers.

In embodiments, a channel of the test thin film transistor may be formed to have a same material and a same shape as a channel of the thin film transistor in the display region.

In embodiments, the display apparatus may further include a compensation circuit part electrically connected to the test patterns and configured to sense a characteristic of the test thin film transistor of each of the test patterns and to compensate for a driving voltage based on an average and a distribution of the characteristic.

According to embodiments of the present inventive concept, the display apparatus may include a base substrate that includes a display region in which an image is displayed and a peripheral region that is anon-display region adjacent to the display region, a plurality of pixels that are disposed on the base substrate in the display region, where each of the pixels includes a thin film transistor including an oxide semiconductor pattern, a data driver that is disposed in the peripheral region and provides a data voltage to the pixels, and a plurality of test patterns that are disposed on the base substrate in the peripheral region, where each of the test patterns includes a test thin film transistor including a test oxide semiconductor pattern.

Because the test patterns are disposed in a space between drivers such as the data drivers and the like in the peripheral region, the test patterns may remain even after the display apparatus is completed. Thus, not only during a manufacturing process, but also after the display apparatus is completed, the thin film transistors may be evaluated, and thus quality of the display apparatus may be improved by compensation according to the evaluation.

DETAILED DESCRIPTION OF THE EMBODIMENTS

Hereinafter, embodiments of the present inventive concept will be explained in detail with reference to the accompanying drawings.

Figure 1:
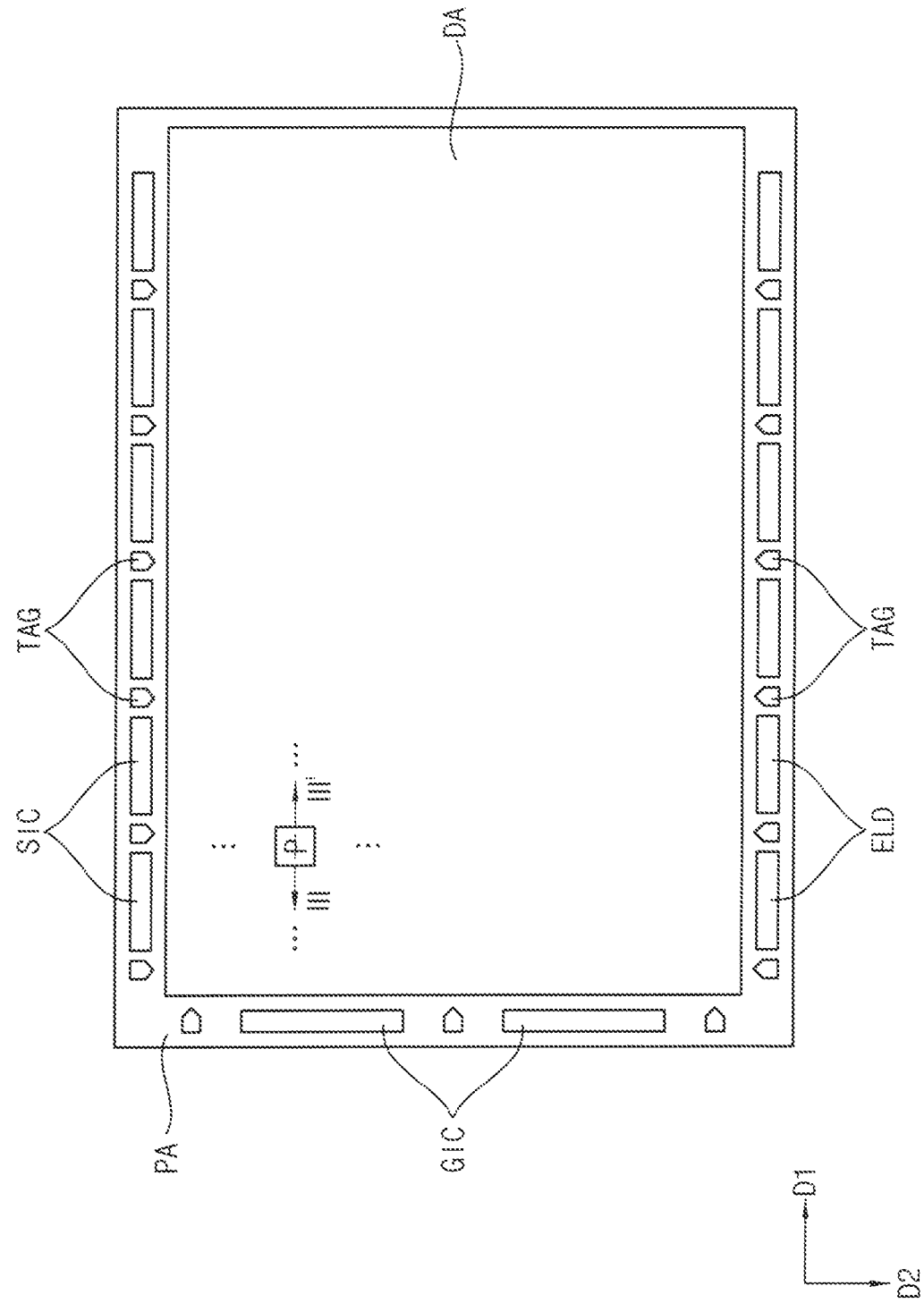
FIG. 1 is a plan view illustrating a display apparatus according to embodiments.

FIG. 1 is a plan view illustrating a display apparatus according to embodiments.

Referring to FIG. 1, the display apparatus may include a display region DA in which an image is displayed and a peripheral region PA that is a non-display region surrounding the display region DA and disposed adjacent to the display region DA.

The display region DA may be disposed on a plane formed by a first direction D1 and a second direction D2 perpendicular to the first direction D1. The display apparatus may include a plurality of pixels P, a plurality of data lines, and a plurality of scan lines. The pixels P may be disposed in the display region DA and may be disposed in a matrix configuration to display an image. Each of the pixels P may include a thin film transistor. The data lines may be electrically connected to the pixels P. The scan lines may cross the data lines.

The peripheral region PA may be a non-display region. The peripheral region PA may be disposed adjacent to the display region DA and may surround an edge of the display region DA. Circuits for driving the pixels P in the display region DA may be formed in the peripheral region PA.

Specifically, a plurality of data drivers SIC, a plurality of gate drivers GIC, and a plurality of emission control drivers ELD may be disposed in the peripheral region PA. In addition, the display apparatus may include a plurality of test patterns TAG that are disposed in the peripheral region PA.

The data driver SIC is a circuit for driving the pixels P. The data driver SIC may be an integrated circuit chip mounted on the display apparatus or a driving circuit formed together with the pixels P on the base substrate of the display apparatus. In some embodiments, the data driver SIC may include a connection pad formed in the display apparatus and an external driving circuit connected thereto.

The gate driver GIC is a circuit for driving the pixels P. The gate driver GIC may be an integrated circuit mounted on the display apparatus or a driving circuit formed together with the pixels P on the base substrate of the display apparatus. In some embodiments, the gate driver GIC may include a connection pad formed in the display apparatus and an external driving circuit connected thereto.

The emission control driver ELD is a circuit for driving the pixels P. The emission control driver ELD may be an integrated circuit mounted on the display apparatus or a driving circuit formed together with the pixels P on the base substrate of the display apparatus. In some embodiments, the gate driver GIC may include a connection pad formed in the display apparatus and an external driving circuit connected thereto.

The data drivers SIC, the gate drivers GIC, and the emission control drivers ELD may be disposed along the peripheral region PA. For example, the data drivers SIC may be arranged along the first direction D1 in an upper portion of the peripheral region PA. The emission control drivers ELD may be arranged along the first direction D1 in a lower portion of the peripheral region PA. The gate drivers GIC may be arranged along the second direction D2 in a left portion of the peripheral region PA.

The test pattern TAG is for testing characteristics of thin film transistors. A test may be performed by connecting a test device to the test pattern TAG. Thus, by examining the characteristics of the thin film transistors from a plurality of test patterns TAG, an average, a distribution, and the like of the characteristics of the thin film transistors may be or obtained. As a result, the quality of the display apparatus may be improved through evaluation of the process or compensation for the distribution.

The test patterns TAG may be formed and arranged along the peripheral region PA. Specifically, the test patterns TAG may be disposed in a space between the data drivers SIC, the gate drivers GIC, and the emission control drivers ELD. For example, as shown in FIG. 1, the test patterns TAG may be arranged to be spaced apart from each other along the first direction D1 in the upper portion of the peripheral region PA, may be arranged to be spaced apart from each other along the second directions D2 in the left portion of the peripheral region PA, and may be arranged to be spaced apart from each other along the first direction D1 in the lower portion of the peripheral region PA. Thus, the test patterns TAG may represent a process difference of the thin film transistors according to locations of the test patterns TAG. As a result, the test patterns TAG may be used to infer the distribution and the like of the characteristics of the thin film transistors in the display region DA.

In addition, because the test patterns TAG are disposed in a space between the data drivers SIC, the gate drivers GIC, and the emission control drivers ELD in the peripheral region PA, the test patterns TAG may remain even after fabrication of the display apparatus is completed. Accordingly, the thin film transistors may be evaluated not only during the manufacturing process but also after finishing the fabrication of the display apparatus, and thus the quality of the display apparatus may be improved by compensation according to the evaluation.

Figure 2:
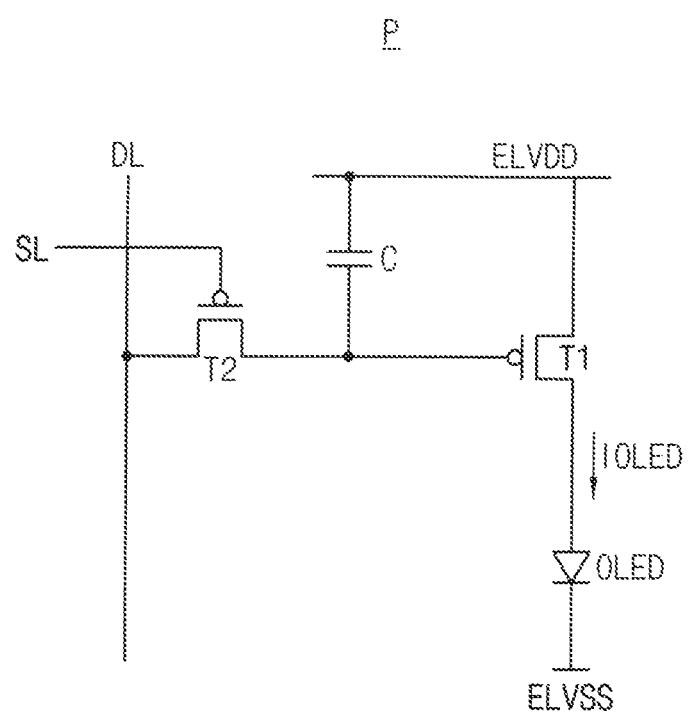
FIG. 2 is a circuit diagram illustrating a pixel included in the display apparatus of FIG. 1.

FIG. 2 is a circuit diagram illustrating a pixel included in the display apparatus of FIG. 1.

Referring to FIG. 2, the pixel P may include two or more thin film transistors T1 and T2, one or more capacitors C, and an organic light emitting element OLED. The thin film transistor may include the first thin film transistor T1 and the second thin film transistor T2.

A control electrode of the second thin film transistor T2 may be connected to a scan line SL. One electrode of the second thin film transistor T2 may be connected to a data line DL and the other electrode of the second thin film transistor T2 may be connected to a control electrode of the first thin film transistor T1. The second thin film transistor T2 may transmit a data voltage V-DATA input from the data line DL to a node connected to the control electrode of the first thin film transistor T1 according to a switching voltage input from the scan line SL.

The capacitor C may be connected between the node connected to the control electrode of the first thin film transistor T1 and a driving power line ELVDD. The capacitor C may store a voltage corresponding to a difference between the data voltage received from the second thin film transistor T2 and a first voltage supplied to the driving power line ELVDD. One electrode of the first thin film transistor T1 may be connected to the driving power line ELVDD, the other electrode of the first thin film transistor T1 may be connected to an anode of the organic light emitting element OLED, and a control electrode of the first thin film transistor T1 may be connected to an electrode of the capacitor C. The first thin film transistor T1 may supply an output current IOELD, which is proportional to a square of a difference between the voltage stored in the capacitor C and a threshold voltage Vth, to the organic light emitting element OLED. The organic light emitting element OLED may emit light in response to the output current IOLED supplied from the first thin film transistor T1. A second voltage may be supplied from the common power line ELVSS to a cathode of the organic light emitting element OLED.

Although not shown, the pixel P may further include an emission control thin film transistor that receives an emission control signal from the emission control driver. In addition, a structure of the pixel P may be variously modified according to requirements, and various known pixel structures may be used.

Figure 3:
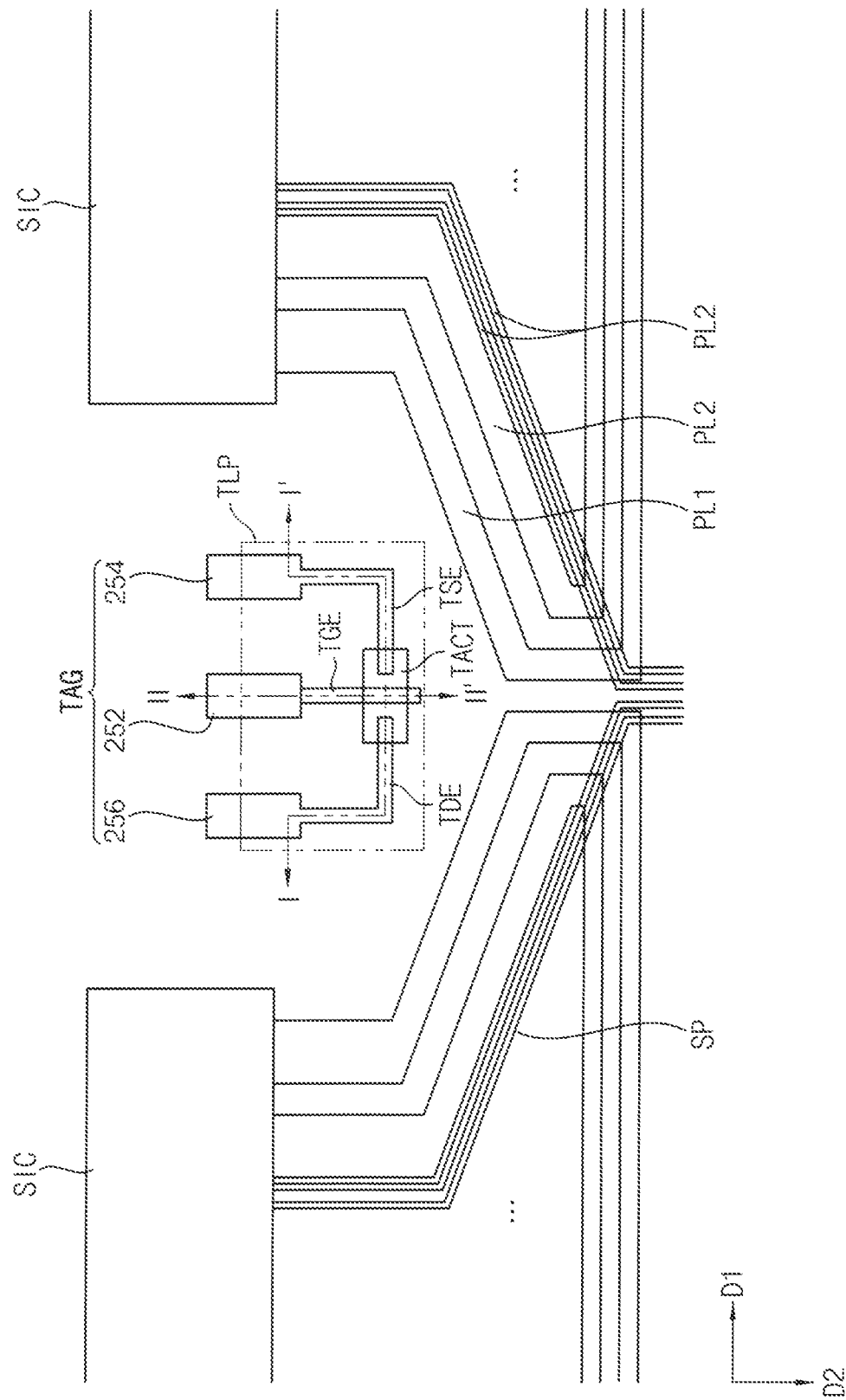
FIG. 3 is a partial enlarged view illustrating a test pattern included the display apparatus of FIG. 1.

FIG. 3 is a partial enlarged view illustrating a test pattern included the display apparatus of FIG. 1.

Referring to FIGS. 1 and 3, the test pattern TAG may be disposed between two data drivers SIC adjacent to each other. Meanwhile, the test pattern TAG may be disposed between the gate drivers GIC adjacent to each other, between the emission control drivers ELD adjacent to each other, and the like as well as between the data drivers SIC adjacent to each other. That is, the test pattern TAG may be disposed in an empty space where the driving circuit is not formed in the peripheral region PA.

The test pattern TAG may include a test thin film transistor and a test electrode. The test thin film transistor may include a test active pattern, which is also referred to as a test oxide semiconductor pattern, TACT, a test source electrode TSE, a test drain electrode TDE, and a test gate electrode TGE. The test electrode may be connected to the test thin film transistor to the test source electrode TSE, the test drain electrode TDE and the test gate electrode TGE.

The test electrode may include a first test electrode 252 connected to the test gate electrode TGE, a second test electrode 254 connected to the test source electrode TSE, and a third test electrode 256 connected to the test drain electrode TDE.

With respect to the test pattern TAG disposed between the two data drivers SIC, a first power line PL1 and a second power line PL2 may be disposed on a right side of the test pattern TAG. The first power line PL1 may supply a first voltage ELVDD, which is a driving power, to the pixels P in the display region DA. The second power line PL2 may supply a second voltage ELVSS, which is a common power, to the pixels P in the display region DA. That is, the first and second power lines PL1 and PL2 may extend from the data driver SIC that is disposed on the right side of the test pattern TAG and may supply the first voltage and the second voltage to the pixels P in the display region DA.

With respect to the test pattern TAG disposed between the two data drivers SIC, the first power line PL1 and the second power line PL2 may be disposed on a left side of the test pattern TAG. The first power line PL1 may supply the first voltage ELVDD, which is the driving power, to the pixels P in the display region DA. The second power line PL may supply the second voltage ELVSS, which is the common power, to the pixels P in the display region DA. That is, the first and second power lines PL1 and PL2 may extend from the data driver SIC that is disposed on the left side of the test pattern TAG and may supply the first voltage and the second voltage to the pixels P in the display region DA.

Meanwhile, spider lines SP for transmitting the data voltage V-DATA from the data driver SIC to the pixels P may be further disposed on the left side and the right side of the test pattern TAG.

Figure 4:
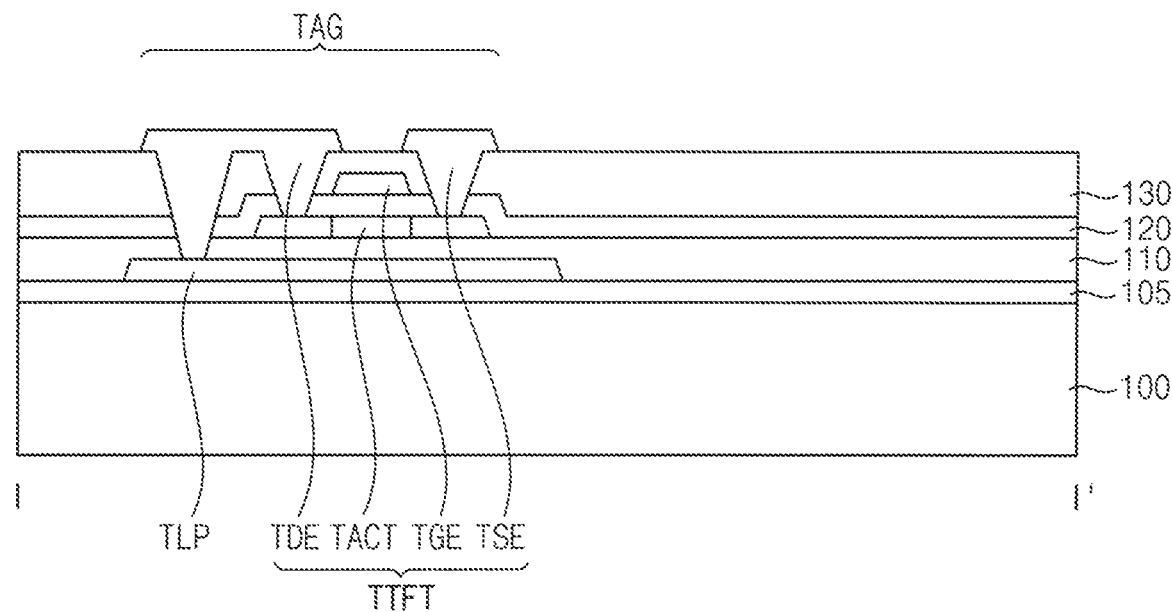
FIG. 4 is a cross-sectional view of the display apparatus taken along a line I-I' in FIG. 3.
Figure 5:
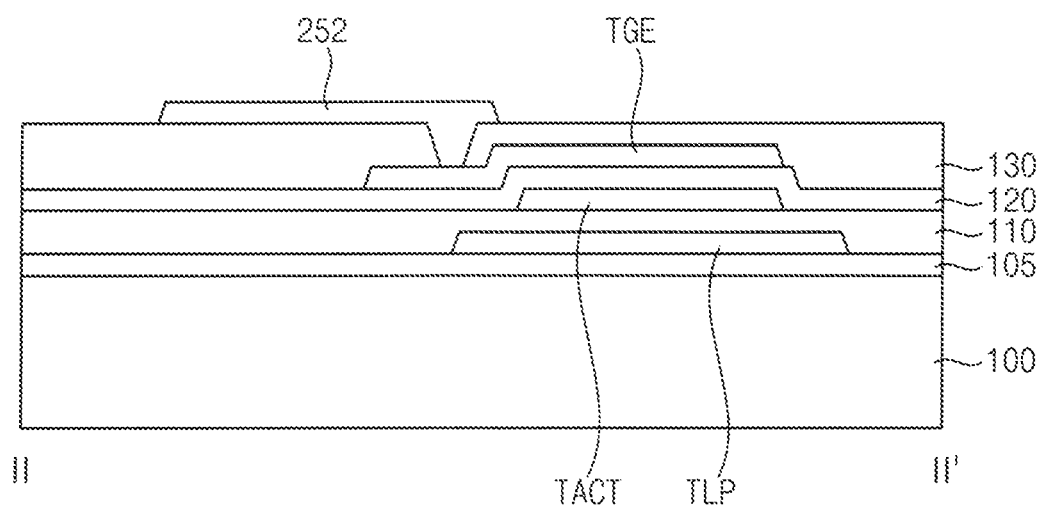
FIG. 5 is a cross-sectional view of the display apparatus taken along a line II-II' in FIG. 3.

FIG. 4 is a cross-sectional view of the display apparatus taken along a line I-r in FIG. 3, and FIG. 5 is a cross-sectional view of the display apparatus taken along a line I-II in FIG. 3.

Referring to FIGS. 4 and 5, in the peripheral region, the display apparatus may include a base substrate 100, a first buffer layer 105, a test lower conductive pattern TLP, a second buffer layer 110, a test oxide semiconductor pattern TACT, a gate insulating layer 120, a gate pattern including a test gate electrode TGE, an interlayer insulating layer 130, a test source electrode TSE, and a data pattern including a test drain electrode TDE.

The base substrate 100 may include a transparent material or a non-transparent (or opaque) material. For example, the base substrate 100 may include a quartz substrate, a synthetic quartz substrate, a calcium fluoride substrate, a fluorine-doped quartz substrate, a sodalime glass substrate, an alkali-free (or non-alkali) glass substrates, and the like. In some embodiments, the base substrate 100 may be formed of a flexible transparent resin substrate. An example of a transparent resin substrate that can be used as the base substrate 100 may be a polyimide substrate.

The first buffer layer 105 may be entirely disposed on the base substrate 100.

The test lower conductive pattern TLP may be disposed on the first buffer layer 105. The test lower conductive pattern TLP may overlap the test thin film transistor TTFT including the test oxide semiconductor pattern TACT and the test gate electrode TGE. The test lower conductive pattern TLP may be disposed between the test thin film transistor TTFT and the base substrate 100 to shield the test thin film transistor TTFT from external influences such as a surge voltage that may be introduced into the test thin film transistor TTFT from the base substrate 100 to prevent a change in the characteristics of the test thin film transistor TTFT.

The second buffer layer 110 may be disposed on the first buffer layer 105 on which the test lower conductive pattern TLP is disposed.

The first buffer layer 105 and the second buffer layer 110 may prevent diffusion of metal atoms or impurities from the base substrate 100 into the test active pattern TACT. The first buffer layer 105 and the second buffer layer 110 may control a heat transfer velocity during a crystallization process for forming the test active pattern TACT to obtain a substantially uniform test active pattern TACT. In addition, when a surface of the base substrate 100 is not uniform, the first buffer layer 105 and the second buffer layer 110 may serve to improve a flatness of the surface of the base substrate 100.

The test active pattern TACT, which may be a test oxide semiconductor pattern TACT, may be disposed on the second buffer layer 110. The test oxide semiconductor pattern TACT may include an oxide semiconductor. For example, the oxide semiconductor may further include indium (In), zinc (Zn), gallium (Ga), titanium (Ti), aluminum (Al), hafnium (Hf), zirconium (Zr), magnesium (Mg), and the like to include a two-component compound (ABx), a three-component compound (ABxCy), a four-component compound (ABxCyDz), and the like. The test oxide semiconductor pattern TACT may include a drain region and a source region that are doped with impurities and a channel region disposed between the drain region and the source region.

The gate insulating layer 120 may be disposed on the second buffer layer 110 on which the test oxide semiconductor pattern TACT is disposed. Specifically, the gate insulating layer 120 may cover the test oxide semiconductor pattern TACT on the second buffer layer 110 and may be disposed to have substantially the same thickness along the profile of the test oxide semiconductor pattern TACT. The gate insulating layer 120 may include an inorganic insulating material such as a silicon compound, a metal oxide, and the like.

The gate pattern including the test gate electrode TGE may be disposed on the gate insulating layer 120. The test gate electrode TGE may be disposed to overlap the test oxide semiconductor pattern TACT. The gate pattern may be formed using a metal, an alloy, a metal nitride, a conductive metal oxide, a transparent conductive material, and the like. For example, the gate pattern may include a metal such as copper, aluminum, and the like having high conductivity.

The interlayer insulating layer 130 may be disposed on the gate insulating layer 120 on which the test gate electrode TGE is disposed. The interlayer insulating layer 130 may include an inorganic insulating material. For example, the interlayer insulating layer 130 may be formed using silicon compounds such as silicon oxide (SiOx), silicon nitride (SiNx), silicon oxynitride (SiOxNy), silicon oxycarbide (SiOxCy), silicon carbonitride (SiCxNy), and the like.

The data pattern including the test source electrode TSE and the test drain electrode TDE may be disposed on the interlayer insulating layer 130. The test source electrode TSE and the test drain electrode TDE may be electrically connected to the source region and the drain region of the test active pattern TACT, respectively, via contact holes that are formed through the interlayer insulating layer 130 and the gate insulating layer 120. The test drain electrode TDE may be electrically connected to the test lower conductive pattern TLP via a contact hole that is formed through the interlayer insulating layer 130, the gate insulating layer 120, and the second buffer layer 110.

The data pattern may be formed using a metal, an alloy, a metal nitride, a conductive metal oxide, a transparent conductive material, and the like. For example, the data pattern may include a metal such as copper, aluminum, and the like having high conductivity.

The test active pattern TACT, the test gate electrode TGE, the test source electrode TSE, and the test drain electrode TDE may be included in the test thin film transistor TTFT. The test pattern TAG may include the test thin film transistor TTFT and first to third test electrodes 252 254 and 256 in FIG. 3.

The first test electrode 252 may be disposed on the interlayer insulating layer 130 and electrically connected to the test gate electrode TGE via a contact hole that is formed through the interlayer insulating layer 130. The second test electrode 254 may be disposed on the interlayer insulating layer 130 and electrically connected to the test source electrode TSE. The third test electrode 256 may be disposed on the interlayer insulating layer 130 and electrically connected to the test drain electrode TDE.

Here, the test thin film transistor TTFT may be formed to have the same structure through the same process as the thin film transistor (see TFT in FIG. 6) disposed in the display region DA.

Accordingly, by examining the characteristics of the test thin film transistor TTFT, the characteristics of the thin film transistor TFT may be inferred.

Figure 6:
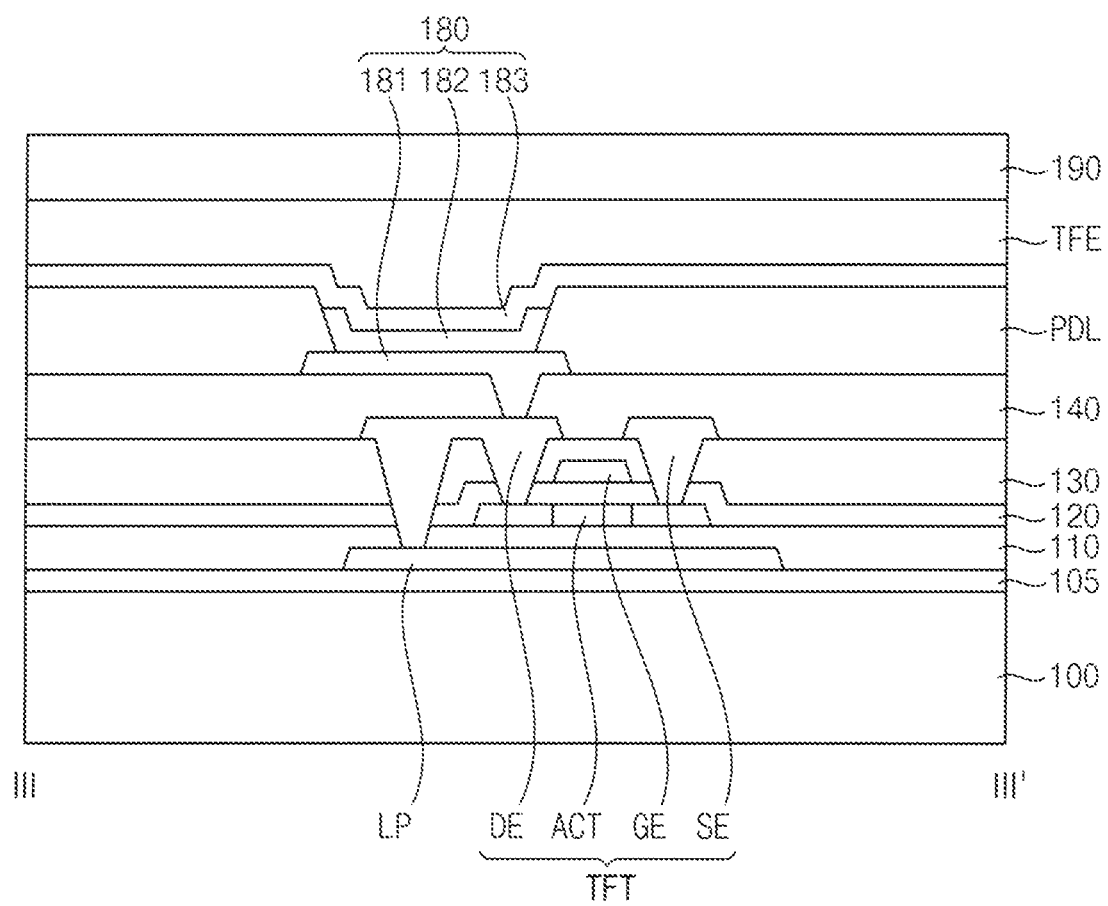
FIG. 6 is a cross-sectional view of the display apparatus taken along a line III-III' in FIG. 1.

FIG. 6 is a cross-sectional view of the display apparatus taken along a line III-III' in FIG. 1.

Referring to FIGS. 4, 5, and 6, in the display region, the display apparatus may include the base substrate 100, the first buffer layer 105, the lower conductive pattern LP, the second buffer layer 110, the oxide semiconductor pattern ACT, the gate insulating layer 120, the gate pattern including the gate electrode GE, the interlayer insulating layer 130, the drain pattern including the source electrode SE and the drain electrode DE, the intermetal dielectric layer 140, the light emitting structure 180, a pixel defining layer PDL, a thin film encapsulation layer TFE, and an opposite substrate 190.

The lower conductive pattern LP may be disposed on the first buffer layer 105. The lower conductive pattern LP may overlap the thin film transistor TFT including the oxide semiconductor pattern ACT and the gate electrode GE. The lower conductive pattern LP may be disposed between the thin film transistor TFT and the base substrate 100 to shield the thin film transistor TFT from external influences such as a surge voltage that may be introduced into the thin film transistor TFT from the base substrate 100 to prevent a change in the characteristics of the thin film transistor TFT).

The oxide semiconductor pattern ACT may be disposed on the second buffer layer 110. The oxide semiconductor pattern ACT may include an oxide semiconductor. For example, the oxide semiconductor may further include indium (In), zinc (Zn), gallium (Ga), titanium (Ti), aluminum (Al), hafnium (LI), zirconium (Zr), magnesium (Mg), and the like to include a two-component compound (ABx), a three-component compound (ABxCy), a four-component compound (ABxCyDz), and the like. The oxide semiconductor pattern ACT may include a drain region and a source region that are doped with impurities and a channel region disposed between the drain region and the source region.

The gate pattern including the gate electrode GE may be disposed on the gate insulating layer 120. The gate electrode GE may be disposed to overlap the oxide semiconductor pattern ACT.

The drain pattern including the source electrode SE and the drain electrode DE may be disposed on the interlayer insulating layer 130. The source electrode SE and the drain electrode DE may be electrically connected to the source region and the drain region of the active pattern ACT, respectively, via contact holes that are formed through the interlayer insulating layer 130 and the gate insulating layer 120. The drain electrode DE may be electrically connected to the lower conductive pattern LP via a contact hole that is formed through the interlayer insulating layer 130, the gate insulating layer 120, and the second buffer layer 110.

The thin film transistor TFT may include the active pattern ACT, the gate electrode GE, the source electrode SE, and the drain electrode DE. Here, the test thin film transistor (see TTFT of FIG. 4) described above may be formed through the same process to have the same characteristics as the thin film transistor TFT. In particular, the channel region of the thin film transistor TFT and the channel region of the test thin film transistor may be formed to have the same shape through the same process.

The intermetal dielectric layer 140 may be disposed on the thin film transistor TFT. The intermetal dielectric layer 140 may be formed to have a single-layered structure but may also be formed to have a multi-layered structure including at least two insulating layers. The intermetal dielectric layer 140 may be formed using an organic material such as a photoresist, an acrylic resin, a polyimide resin, a polyamide resin, a siloxane-based resin, and the like.

The light emitting structure 180 may include a first electrode 181, a light emitting layer 182, and a second electrode 183.

The first electrode 181 may be disposed on the intermetal dielectric layer 140. Depending on a light emitting method of the display apparatus, the first electrode 181 may be formed using a reflective material or a light transmissive material. In some embodiments, the first electrode 181 may have a single-layered structure or a multi-layered structure including a metal film, an alloy film, a metal nitride film, a conductive metal oxide film, and/or a transparent conductive material film.

The pixel defining layer PDL may be disposed on the intermetal dielectric layer 140 on which the first electrode 181 is disposed. The pixel defining layer PDL may be formed using an organic material, an inorganic material, and the like. For example, the pixel defining layer PDL may be formed using a photoresist, a polyacrylic resin, a polyimide resin, an acrylic resin, a silicone compound, and the like. In some embodiments, the pixel defining layer PDL may be etched to form an opening partially exposing the first electrode 181. An emission region and a non-emission region of the display apparatus may be defined by the opening of the pixel defining layer PDL. For example, a region in which the opening of the pixel definition layer PDL is located may correspond to the emission region, and a region adjacent to the opening of the pixel definition layer PDL may correspond to the non-emission region.

The light emitting layer 182 may be disposed on the first electrode 181 exposed through the opening of the pixel defining layer PDL. In addition, the light emitting layer 182 may extend onto a sidewall of the opening of the pixel defining layer PDL. In an embodiment, the light emitting layer 182 may have a multi-layered structure including an organic emission layer, a hole injection layer, a hole transport layer, an electron transport layer, an electron injection layer, and the like. In another embodiment, except for the organic emission layer, the hole injection layer, the hole transport layer, the electron transport layer, the electron injection layer, and the like may be commonly formed to correspond to a plurality of pixels. The organic emission layer of the light emitting layer 182 may be formed using light emitting materials capable of generating different color lights such as red light, green light, and blue light according to respective pixels of the display apparatus. In some embodiments, the organic emission layer of the light emitting layer 182 may have a structure in which a plurality of light emitting materials capable of generating (or implementing) different color lights such as red light, green light, blue light, and the like are stacked to emit white light. In this case, the light emitting structures may be commonly formed to correspond to a plurality of pixels and the pixels may implement colors by using color filter layers.

The second electrode 183 may be disposed on the pixel defining layer PDL and the light emitting layer 182. Depending on the light emitting method of the display apparatus, the second electrode 183 may include a light transmissive material or a reflective material. In some embodiments, the second electrode 183 may also have a single-layered structure or a multi-layered structure including a metal film, an alloy film, a metal nitride film, a conductive metal oxide film, and/or a transparent conductive material film.

The thin film encapsulation layer TFE may be disposed on the second electrode 183. The thin film encapsulation layer TFE may prevent penetration of moisture and oxygen from the outside. The thin film encapsulation layer TFE may include at least one organic layer and at least one inorganic layer. At least one organic layer and at least one inorganic layer may be alternately stacked with each other. For example, the thin film encapsulation layer TFE may include two inorganic layers and one organic layer disposed therebetween. However, a structure of the thin film encapsulation layer TFE is not limited thereto. In some embodiments, instead of the thin film encapsulation layer TFE, a sealing substrate may be provided to block (or prevent) the penetration of external air and moisture into the display apparatus. The opposite substrate 190 may be attached to the thin film encapsulation layer TFE.

Figure 7:
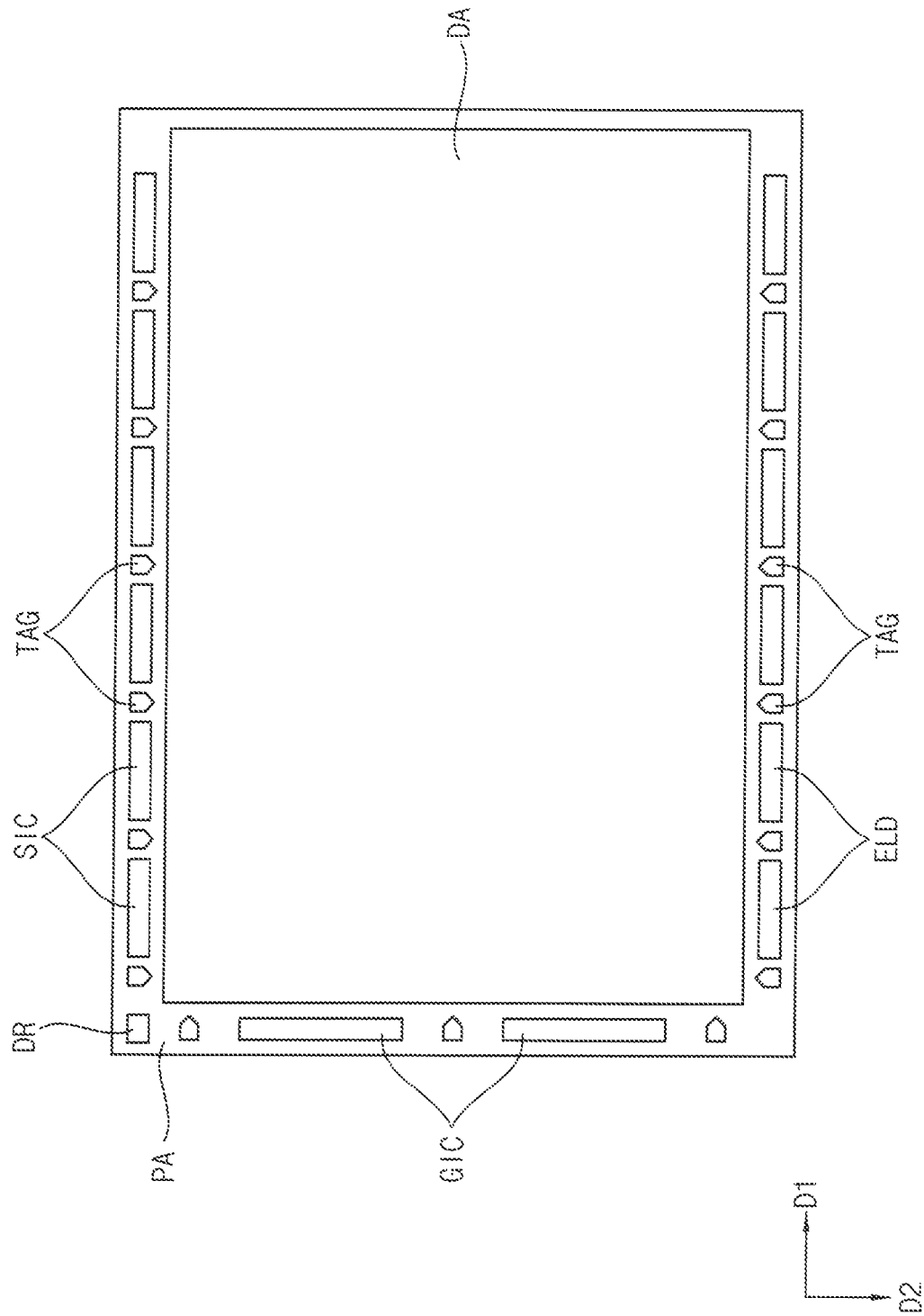
FIG. 7 is a plan view illustrating a display apparatus according to embodiments.
Figure 8:
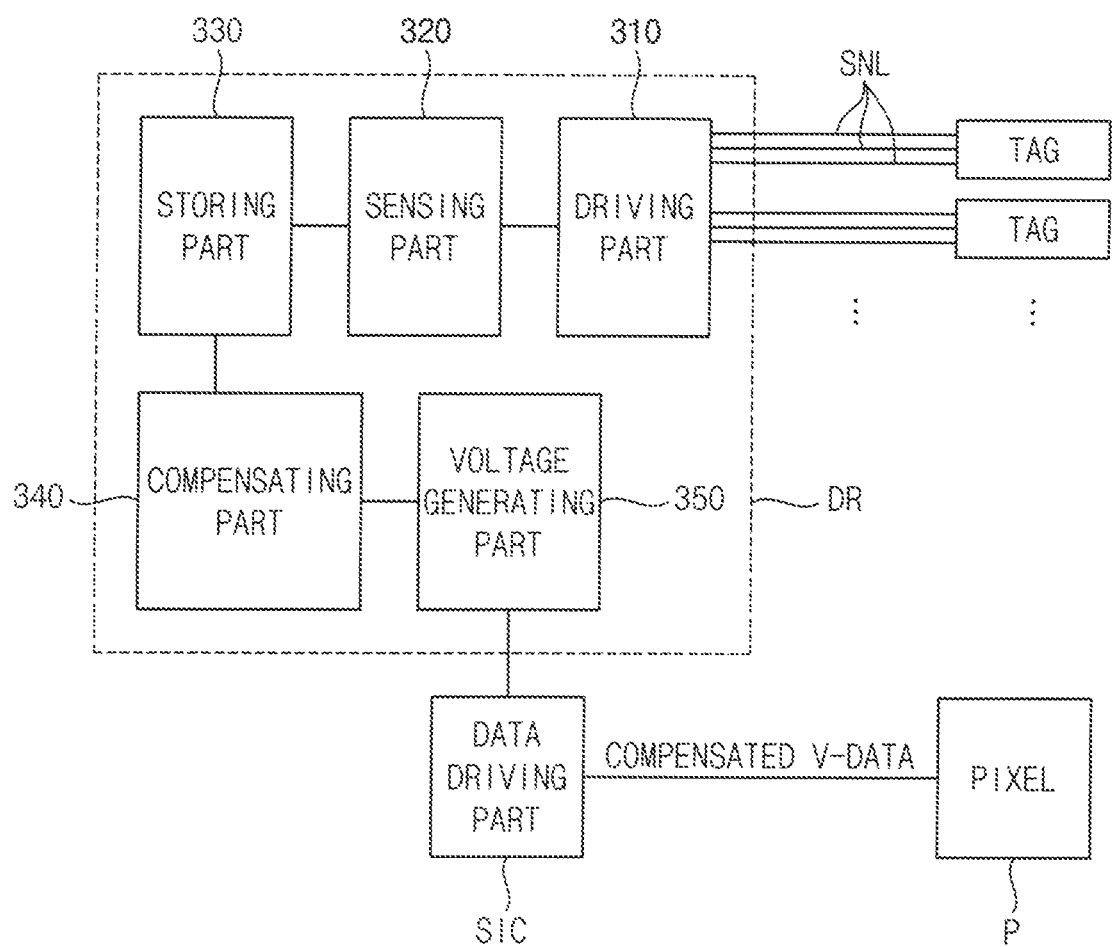
FIG. 8 is a block diagram illustrating a compensation circuit part in FIG. 7.

FIG. 7 is a plan view illustrating a display apparatus according to embodiments, and FIG. 8 is a block diagram illustrating a compensation circuit part DR in FIG. 7. Except that the display apparatus further includes the compensation circuit part DR, the display apparatus is substantially the same as the display apparatus of FIGS. 1 to 6. Thus, duplicated description will not be repeated.

Referring to FIGS. 7 and 8, the display apparatus may include a display region DA in which an image is displayed and a peripheral region PA that is a non-display region disposed adjacent to the display region DA to surround the display region DA.

A plurality of data drivers SIC, a plurality of gate drivers GIC, a plurality of emission control drivers ELD, and a plurality of test patterns TAG may be disposed in the peripheral region PA.

In addition, a compensation circuit DR may be further disposed in the peripheral region PA. The compensation circuit DR may include a driving part 310, a sensing part 320, a storing part 330, a compensating part 340, and a voltage generating part 350.

The compensation circuit DR may be electrically connected to the test patterns TAG via a signal line SNL. The compensation circuit DR may input a test driving voltage to the test thin film transistor (see TTFT in FIG. 2) of each of the test patterns TAG, may receive a test signal from the test thin film transistor, and may sense characteristics of the test thin film transistor of each of the test patterns TAG. That is, the test thin film transistors of the test patterns TAG may represent the thin film transistors (see TFT in FIG. 6) in the display region DA of the display apparatus. Thus, using the test thin film transistors, an average, a distribution (or dispersion), and the like of the characteristics of the thin film transistors in the display region DA may be inferred. Here, the characteristics of the thin film transistors may be a threshold voltage (Vth), a driving current (Ids), and the like.

The compensation circuit DR may compensate for driving voltages for driving the display apparatus in an appropriate range by using information such as the average, the distribution, and the like. The driving voltages may include a data voltage V-DATA, a driving voltage ELVDD, a common voltage ELVSS, and the like. Various known methods may be applied to compensate for the driving voltages. Thus, an optimum driving voltage range may be calculated by using the average, the distribution, and the like of measured characteristics of the test thin film transistors.

For example, the driving part 310 may provide the test driving voltage to the test thin film transistor of each of the test patterns TAG. The sensing part 320 may receive a test signal from the test thin film transistor and may sense the characteristics (e.g., the threshold voltage, the driving current, and the like) of the test thin film transistor of each of the test patterns TAG. The storing part 330 may store the sensed characteristics over time. The compensating part 340 may appropriately compensate for the driving voltage by using the sensed characteristics. The voltage generating part 350 may provide the compensated driving voltage to the data driver SIC. The data driver SIC may provide the compensated data voltage V-DATA to the pixels (see P in FIG. 1) in the display region DA to display an image to the display apparatus. Accordingly, even when the characteristics of the thin film transistors in the display region DA of the display apparatus change for each product or change over time according to a manufacturing process condition, uniform display quality may be maintained, and thus, display quality of the display apparatus may be improved.

Figure 9:
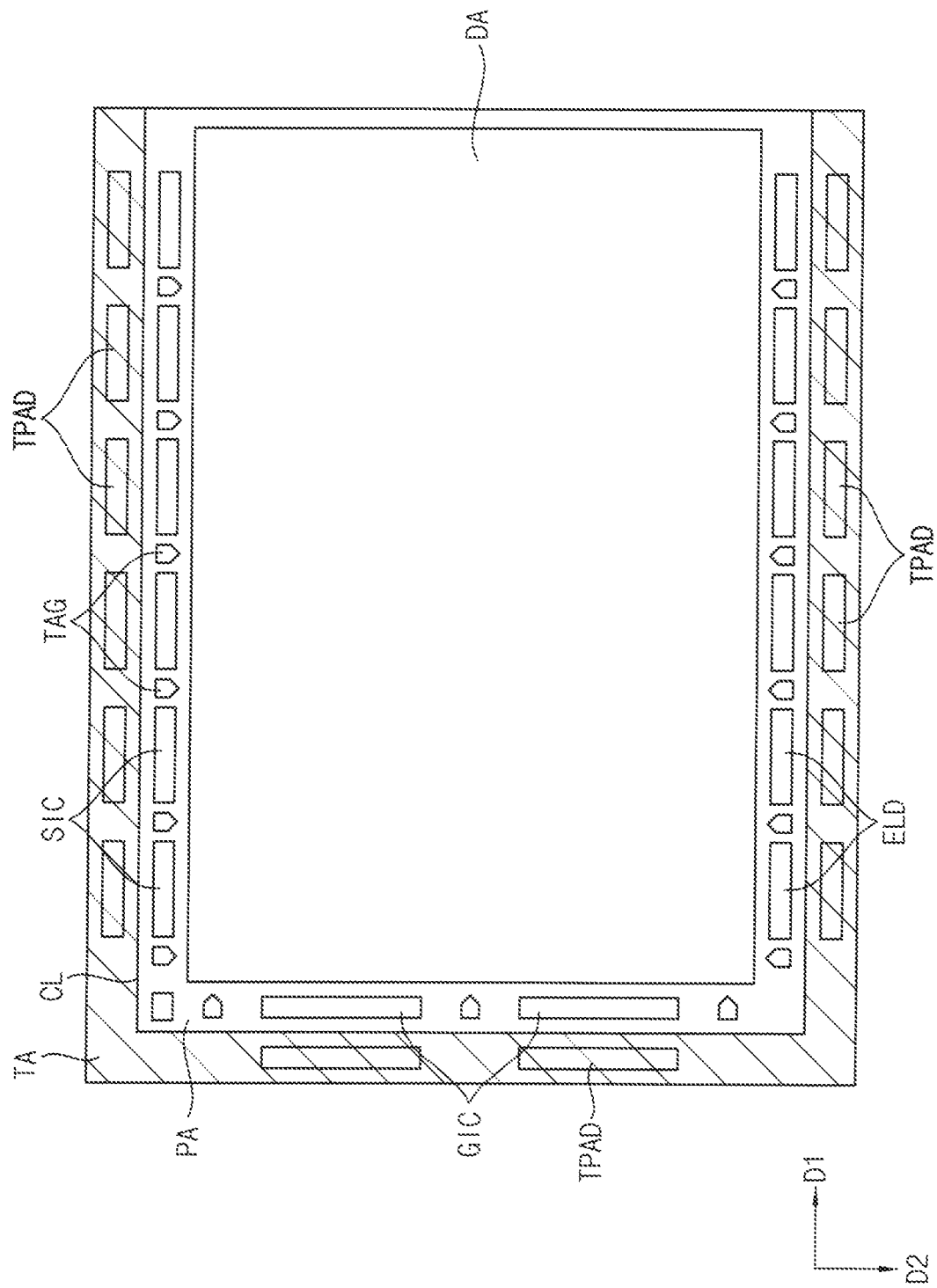
FIG. 9 is a plan view illustrating a display apparatus according to embodiments before a base substrate corresponding to a test region is removed.

FIG. 9 is a plan view illustrating a display apparatus according to embodiments before a base substrate corresponding to a test region is removed.

Referring to FIG. 9, the display apparatus may include a display region DA in which an image is displayed and a peripheral region PA that is a non-display region disposed adjacent to the display region DA to surround the display region DA. In addition, the display apparatus may further include a test region TA surrounding the peripheral region PA. That is, the peripheral region PA may be disposed between the test region TA and the display region DA.

In the peripheral region PA, a circuit structure for driving the pixels (see P in FIG. 1) of the display region DA may be formed. Specifically, a plurality of data drivers SIC, a plurality of gate drivers GIC, and a plurality of emission control drivers ELD may be disposed in the peripheral region PA. In addition, the display apparatus may include a plurality of test patterns TAG disposed in the peripheral region PA.

A plurality of test pads TPAD electrically connected to the pixels (see P in FIG. 1) of the display region DA may be disposed in the test region TA. The test pads TPAD may include a gate test pad part and a data test pad part. The gate test pad part may receive gate test signals corresponding to gate driving signals for driving the gate driver GIC. The data test pad part may receive data test signals for driving data lines.

Here, the test region TA is a region that is cut and removed after a test of the display apparatus is completed. Thus, the test region TA may be cut and removed along a cutting line CL after an array test process of the display apparatus, and thus only the display region DA and the peripheral region PA may remain. Because the test pattern TAG is disposed in the peripheral region PA which is not removed, even after the array test process of the display apparatus, the characteristics of the thin film transistors of the pixels in the display region DA may be monitored as needed.

Figure 10:
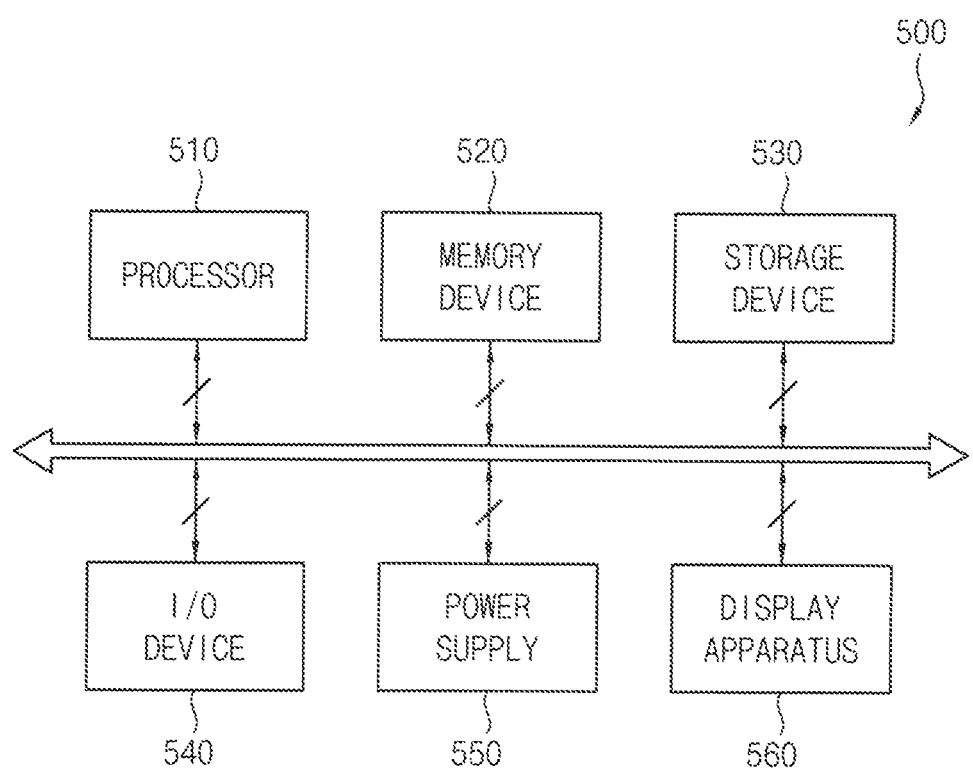
FIG. 10 is a block diagram illustrating an electronic device according to embodiments.
Figure 11A:
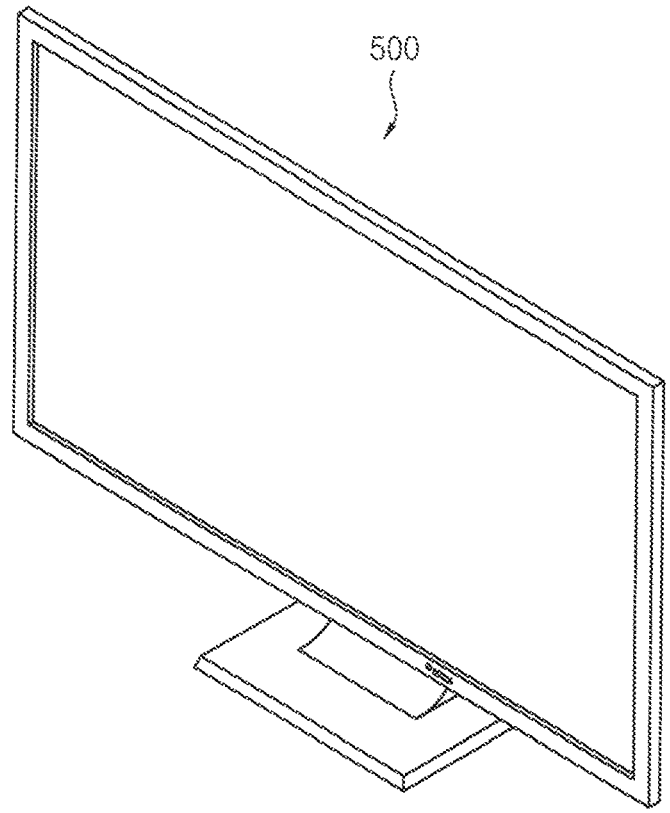
FIG. 11A is a diagram illustrating an example in which the electronic device of FIG. 10 is implemented as a television.
Figure 11B:
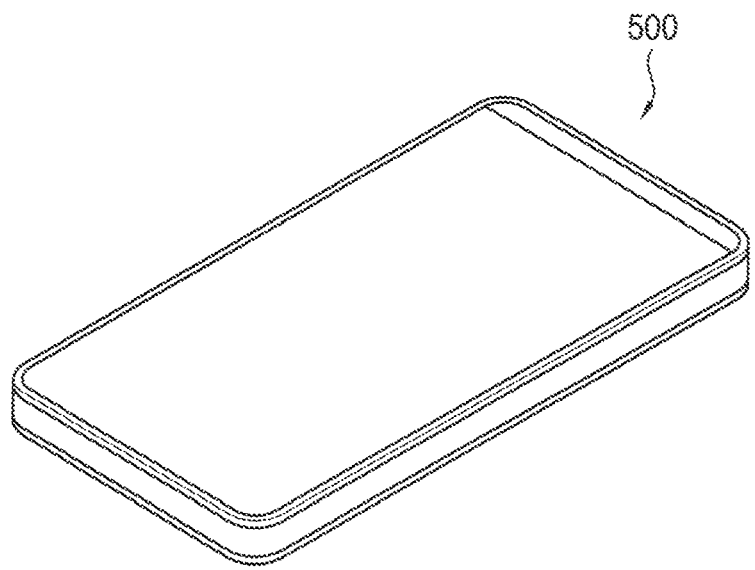
FIG. 11B is a diagram illustrating an example in which the electronic device of FIG. 10 is implemented as a smart phone.

FIG. 10 is a block diagram illustrating an electronic device according to embodiments, FIG. 11A is a diagram illustrating an example in which the electronic device of FIG. 10 is implemented as a television, and FIG. 11B is a diagram illustrating an example in which the electronic device of FIG. 10 is implemented as a smart phone.

Referring to FIGS. 10 to 11B, the electronic device 500 may include a processor 510, a memory device 520, a storage device 530, an input/output (I/O) device 540, a power supply 550, and a display apparatus 560. Here, the display apparatus 560 may be the display apparatus of FIG. 1. In addition, the electronic device 500 may further include a plurality of ports for communicating with a video card, a sound card, a memory card, a universal serial bus (USB) device, other electronic devices, and the like. In an embodiment, as illustrated in FIG. 11A, the electronic device 500 may be implemented as a television. In another embodiment, as illustrated in FIG. 11B, the electronic device 500 may be implemented as a smart phone. However, the electronic device 500 is not limited thereto. For example, the electronic device 500 may be implemented as a cellular phone, a video phone, a smart pad, a smart watch, a tablet PC, a car navigation system, a computer monitor, a laptop, a head mounted display (HMD) apparatus, and the like.

The processor 510 may perform various computing functions. The processor 510 may be a micro-processor, a central processing unit (CPU), an application processor (AP), and the like. The processor 510 may be coupled to other components via an address bus, a control bus, a data bus, and the like. Further, the processor 510 may be coupled to an extended bus such as a peripheral component interconnection (PCI) bus. The memory device 520 may store data for operations of the electronic device 500. For example, the memory device 520 may include a non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or a volatile memory device such as a dynamic random access memory (DRAM) device, a static random access memory (SRAM) device, a mobile DRAM device, and the like. The storage device 530 may include a solid state drive (SSD) device, a hard disk drive (HDD) device, a CD-ROM device, and the like. The I/O device 540 may include an input device such as a keyboard, a keypad, a mouse device, a touch-pad, a touch-screen, and the like and an output device such as a printer, a speaker, and the like. The power supply 550 may provide power for operations of the electronic device 500.

The display apparatus 560 may be coupled to other components via the buses or other communication links. In some embodiments, the display apparatus 560 may be included in the I/O device 540. As described above, the display apparatus 560 may include test patterns disposed in a space between drivers in a peripheral region that remains even after the fabrication of the display apparatus is completed. Thus, not only during a manufacturing process, but also after the display apparatus is completed, thin film transistors may be evaluated, and thus quality of the display apparatus may be improved by compensation according to the evaluation. Since these are described above, duplicated description related thereto will not be repeated.

The present inventive concept may be applied to an organic light emitting display apparatus and an electronic device including the organic light emitting display apparatus. For example, the present inventive concept may be applied to a cellular phone, a smart phone, a video phone, a smart pad, a smart watch, a tablet PC, a car navigation system, a television, a computer monitor, a laptop, a head mounted display (HMD) apparatus, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

The invention claimed is:

1. A display apparatus comprising:
   a base substrate including a display region in which an image is displayed and a peripheral region that is a non-display region disposed adjacent to the display region;
   a plurality of pixels disposed on the base substrate in the display region, each of the pixels including a thin film transistor that includes a semiconductor pattern;
   a plurality of drivers disposed in the peripheral region and configured to provide driving signals to the pixels;
   a plurality of test patterns disposed on the base substrate in the peripheral region between adjacent drivers, each of the test patterns including a test thin film transistor that includes a test semiconductor pattern; and
   a compensation circuit part electrically connected to the test patterns and configured to sense a characteristic of the test thin film transistor of each of the test patterns and to compensate for a driving voltage based on an average and a distribution of the characteristic.

2. The display apparatus of claim 1, wherein the plurality of drivers are data drivers.

3. The display apparatus of claim 2, wherein the test semiconductor pattern of the test pattern is formed to have a same material and a same shape as the semiconductor pattern of the pixel.

4. The display apparatus of claim 2, further comprising:
   a test lower conductive pattern disposed between the base substrate and the test semiconductor pattern; and
   a lower conductive pattern disposed between the base substrate and the semiconductor pattern,
   wherein the test thin film transistor further includes a test gate electrode that overlaps the test semiconductor pattern and a test source electrode and a test drain electrode that are electrically connected to the test semiconductor pattern, and
   wherein the thin film transistor further includes a gate electrode that overlaps the semiconductor pattern and a source electrode and a drain electrode that are electrically connected to the semiconductor pattern.

5. The display apparatus of claim 4, further comprising:
   an interlayer insulating layer disposed between the test gate electrode and the test source electrode and the test drain electrode,
   wherein each of the test patterns further includes:
   a first test electrode disposed on the interlayer insulating layer and electrically connected to the test gate electrode via a contact hole that is formed through the interlayer insulating layer;
   a second test electrode disposed on the interlayer insulating layer and electrically connected to the test source electrode; and a third test electrode disposed on the interlayer insulating layer and electrically connected to the test drain electrode.

6. The display apparatus of claim 5, further comprising:
an intermetal dielectric layer disposed on the thin film transistor;
a first electrode disposed on the intermetal dielectric layer and electrically connected to the drain electrode of the thin film transistor;
a light emitting layer disposed on the first electrode; and
a second electrode disposed on the light emitting layer.

7. The display apparatus of claim 6, further comprising:
an opposite substrate disposed on the base substrate and disposed to be spaced apart from the test pattern in a plan view.

8. The display apparatus of claim 2, wherein the data driver is an integrated circuit chip mounted on the base substrate.

9. The display apparatus of claim 2, further comprising:
right-first and right-second power lines disposed on a right side of the test pattern with respect to the test pattern disposed between the two adjacent data drivers; and
left-first and left-second power lines disposed on a left side of the test pattern with respect to the test pattern disposed between the two adjacent data drivers,
wherein the right-first power line and the right-second power line extend from the data driver that is disposed on the right side of the test pattern and provide first power and second power to corresponding pixels in the display region, and
wherein the left-first power line and the left-second power line extend from the data driver that is disposed on the left side of the test pattern and provide the first power and the second power to corresponding pixels in the display region.

10. The display apparatus of claim 2, wherein the test patterns are disposed to be spaced apart from each other along a length direction of the peripheral region.

11. The display apparatus of claim 2, further comprising:
a test region disposed adjacent to the peripheral region,
wherein the peripheral region is disposed between the test region and the display region, and
wherein a plurality of test pads that are electrically connected to the pixels of the display region are formed in the test region.

12. The display apparatus of claim 2, wherein the test region is cut and removed after a test of the display apparatus is completed.

13. The display apparatus of claim 12, wherein the characteristic is a threshold voltage of the test thin film transistor and the driving voltage is the data voltage.

14. The display apparatus of claim 13, wherein the compensation circuit part includes:
a driving part configured to provide a test driving voltage to the test thin film transistor of the each of the test patterns;
a sensing part configured to receive a test signal from the test thin film transistor and to sense the characteristic of the test thin film transistor; and
a compensating part configured to compensate for the driving voltage using the characteristic that is sensed.

15. The display apparatus of claim 14, wherein the compensation circuit part further includes:
a storing part configured to store the characteristic that the sensing part senses; and
a voltage generating part configured to provide the compensated driving voltage to the data driver.

16. A display apparatus which includes a display region in which a plurality of pixels are disposed and a peripheral region that is a non-display region disposed adjacent to the display region, the display apparatus comprising:
a thin film transistor disposed in the display region and including a semiconductor;
a plurality of test patterns disposed in the peripheral region between adjacent drivers; and
a compensation circuit part electrically connected to the test patterns and configured to sense a characteristic of a test thin film transistor of each of the test patterns and to compensate for a driving voltage based on an average and a distribution of the characteristic.

17. The display apparatus of claim 16, wherein the drivers are data drivers.

18. The display apparatus of claim 17, wherein a channel of the test thin film transistor is formed to have a same material and a same shape as a channel of the thin film transistor in the display region.

* * * * *